United States Patent
Lee

(10) Patent No.: US 8,198,156 B2
(45) Date of Patent: Jun. 12, 2012

(54) NON-VOLATILE MEMORY DEVICE AND METHOD FOR FABRICATING THE SAME

(75) Inventor: Nam-Jae Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/012,259

(22) Filed: Jan. 24, 2011

(65) Prior Publication Data

US 2011/0115013 A1 May 19, 2011

Related U.S. Application Data

(62) Division of application No. 12/492,402, filed on Jun. 26, 2009, now Pat. No. 7,897,456.

(30) Foreign Application Priority Data

Apr. 30, 2009 (KR) .................. 10-2009-0038541

(51) Int. Cl.
*H01L 21/8238* (2006.01)
*H01L 21/336* (2006.01)
*H01L 21/4763* (2006.01)

(52) U.S. Cl. ........ 438/257; 438/201; 438/211; 438/266; 438/288; 257/E21.66; 257/E21.678; 257/E21.679; 257/E21.687; 257/E21.688

(58) Field of Classification Search ............. 257/E21.66, 257/E21.678, E21.679, E21.687, E21.688
See application file for complete search history.

(56) References Cited

U.S. PATENT DOCUMENTS

2007/0184606 A1* 8/2007 You et al. ...................... 438/211
2008/0315281 A1* 12/2008 Park .............................. 257/315

FOREIGN PATENT DOCUMENTS

KR 100389039 6/2003

OTHER PUBLICATIONS

Notice of Preliminary Rejection issued from Korean Intellectual Property Office on Jan. 18, 2011.

* cited by examiner

*Primary Examiner* — Mohsen Ahmadi

(74) *Attorney, Agent, or Firm* — IP & T Group LLP

(57) ABSTRACT

A non-volatile memory device includes a peripheral circuit region and a cell region. A method for fabricating the non-volatile memory device includes forming gate patterns over a substrate, the gate pattern including a tunnel insulation layer, a floating gate electrode, a charge blocking layer and a control gate electrode, and removing the control gate electrode and the charge blocking layer of the gate pattern formed in the peripheral circuit region.

5 Claims, 10 Drawing Sheets

NON-VOLATILE MEMORY DEVICE AND METHOD FOR FABRICATING THE SAME

CROSS-REFERENCE TO RELATED APPLICATIONS

This application is a division of U.S. patent application Ser. No. 12/492,402 filed on Jun. 26, 2009, now U.S. Pat. No. 7,897,456 which claims priority of Korean patent application number 10-2009-0038541, filed on Apr. 30, 2009. The disclosure of each of the foregoing applications is incorporated herein by reference in its entirety.

BACKGROUND OF THE INVENTION

The present invention relates to a semiconductor memory device and a method for fabricating the same, and more particularly, to a non-volatile memory device and a method for fabricating the same.

A non-volatile memory device is capable of retaining stored data even when power to the memory device is turned off. In particular, since the non-volatile memory device stores data by supplying charges into a floating gate electrode, it is referred to as a floating gate non-volatile memory device.

Herein, the non-volatile memory device includes a cell region and a peripheral circuit region. While a gate pattern of the cell region stores data by supplying or releasing charges into or from the floating gate electrode, a gate pattern of the peripheral circuit region operates as a typical transistor. Therefore, when forming the gate patterns, there is required a process of forming a contact hole in a charge blocking layer of the peripheral circuit region to connect the floating gate electrode and a control gate electrode.

Hereinafter, a method for fabricating a non-volatile memory device according to the prior art and its problems will be described with reference to figures.

FIG. 1 illustrates a layout of the non-volatile memory device according to the prior art.

Referring to FIG. 1, an active region A is defined by a device isolation layer formed as a line type that is disposed in a field region F. On a substrate, a bit line BL is disposed in a first direction A-A' and a plurality of source selection lines SSL and a plurality of drain selection lines DSL are disposed in a second direction B-B' intersecting with the first direction A-A'. Furthermore, a plurality of word lines WL is disposed between the source selection lines SSL and the drain selection lines DSL.

Herein, the source selection lines SSL connect gate electrodes of source selection transistors and a common source line CSL is disposed in a junction region between the source selection lines SSL. The drain selection lines DSL connect gate electrodes of drain selection transistors and drain contact plugs DCT are disposed in a junction region between the drain selection lines DSL.

The source selection lines SSL or the drain selection lines DSL are formed in the peripheral circuit region to operate as typical transistors, and memory cells storing data are formed in the cell region.

FIGS. 2A to 2E illustrate sectional views explaining a method for fabricating the non-volatile memory device according to the prior art and cross-sectional views taken along the first direction A-A' of FIG. 1.

Referring to FIG. 2A, after forming a tunnel insulation layer 21 and a conducting layer for a floating gate electrode on a substrate 20, a plurality of floating gate electrode patterns 22 extending parallel to the first direction A-A' is formed performing a patterning process and a process of forming a device isolation layer.

Then, a charge blocking layer 23 and a protection layer 24 are formed on the floating gate electrode pattern 22. Herein, the protection layer 24 is formed to prevent the charge blocking layer 23 from being damaged in a subsequent process of forming a contact hole in the charge blocking layer 23.

Subsequently, a charge blocking layer contact mask 25 is formed on the protection layer 24. At this point, the charge blocking layer contact mask 25 is formed to expose a peripheral circuit region, e.g., a portion of a region where selection lines are to be formed. This is to connect floating gate electrodes and control gate electrodes that are to be formed in the peripheral circuit region in subsequent processes and thus make the selection lines of the peripheral circuit region operate as normal transistors.

Referring to FIG. 2B, a charge blocking layer contact hole is formed by etching the protection layer 24 and the charge blocking layer 23 using the charge blocking layer contact mask 25 as an etch barrier. In this figure, a protection layer including the charge blocking layer contact hole is indicated by a reference numeral 24A and a charge block layer including the charge blocking layer contact hole is indicated by a reference numeral 23A.

After forming a conducting layer 26 and a hard mask layer 27 on a resultant structure including the charge blocking layer contact hole, a mask pattern 28 is formed on the hard mask layer 27.

Referring to FIG. 2C, the hard mask layer 27, the conducting layer 26, the protection layer 24A, the charge blocking layer 23A and the floating gate electrode pattern 22A are sequentially etched using the mask pattern 28 as an etch barrier.

As a result, a gate pattern including the tunnel insulation layer 21, an etched floating gate electrode pattern 22A, an etched charge blocking layer 23B, an etched protection layer 24B and an etched conducting layer 26A is formed, wherein the etched floating gate electrode pattern 22A is referred to as a floating gate electrode and the etched conducting layer 26A is referred to as a control gate electrode hereinafter. Herein, in the gate pattern formed in the peripheral circuit region, the floating gate electrode 22A and the control gate electrode 26A are connected to each other by the contact hole.

Referring to FIG. 2D, after an oxide spacer 29 is formed on a sidewall of the gate pattern, a nitride spacer 30 is formed on the whole surface of a resultant structure including the oxide spacer 29.

After forming a first inter-layer insulation layer 31 on the whole surface of a resultant structure including the nitride spacer 30, a planarization process is performed on the first inter-layer insulation layer 31 until a top surface of the nitride spacer 30 is exposed.

Referring to FIG. 2E, the first inter-layer insulation layer 31, the nitride spacer 30 and the oxide spacer 29 are etched back to a given depth from a top surface of the gate pattern to expose a portion of the control gate electrode 26A.

Then, a metal silicide control gate electrode 26B is formed by performing a metal silicidation process on the partially exposed control gate electrode 26A.

Subsequently, a second inter-layer insulation layer 32, a nitride spacer 33 and a third inter-layer insulation layer 34 are sequentially formed on the whole surface of a resultant structure including the metal silicide control gate electrode 26B.

The third inter-layer insulation layer 34, the nitride spacer 33, the second inter-layer insulation layer 32, the first inter-layer insulation layer 31, the nitride spacer 30 and the tunnel insulation layer 21 are selectively etched to form a contact hole that exposes a portion of the substrate 20 disposed between the gate patterns formed in the peripheral circuit region. Then, a contact plug is formed by filling the contact hole with a conducting layer 35.

According to the prior art as described above, the floating gate electrode 22A and the control gate electrode 26B of the gate pattern formed in the peripheral circuit region are connected to each other through the process of forming the charge blocking layer contact hole. That is, while a memory cell is formed by separating the floating gate electrode 22A from the control gate electrode 26B in a cell region, a selection line may be formed by connecting the floating gate electrode 22A and the control gate electrode 26B in the peripheral circuit region.

However, according to the prior art, since there is required the process of forming the charge blocking layer contact hole, the fabricating process is complicated and thus there is limitations in improving a degree of integration of a memory device. Problems of the prior art will be described in detail hereinafter.

First of all, since an area is reduced by the improvement of the degree of integration of the memory device, it is difficult to allocate the charge blocking layer contact mask 25 in a desired position and perform an etching process. That is, it is not easy to form the contact hole and thus the probability, that the transistors formed in the peripheral circuit region abnormally operate, increases.

Second, there occurs the signal delay. Since the contact hole is formed by etching a portion of the charge blocking layer 23 when forming the gate pattern in the peripheral circuit region, the floating gate electrode 22A cannot be connected to the control gate electrode 26B as one body through all of them and they are connected to each other through a contact formed in their portions. Therefore, the signal delay occurs by the contact resistance and the performance of the memory device is deteriorated since the signal delay further increases in a region far from the contact.

Third, an electrical characteristic of the memory device changes since an interface between the protection layer 24B and the control gate electrode 26B becomes unstable. Herein, the protection layer 24B is formed on the charge blocking layer 23B to prevent the damage of the charge blocking layer 23B when forming the contact hole, and the protection layer 24B is typically formed of polysilicon. Like this, since the control gate electrode 26B is formed on the resultant structure including the contact hole that is formed by etching the protection layer 24B and the charge blocking layer 23B, the interface between the protection layer 24B and the control gate electrode 26B becomes unstable and thus the performance of the memory device is deteriorated.

Meanwhile, according the prior art, the gate pattern including the tunnel insulation layer 21, the floating gate electrode 22A, the charge blocking layer 23B, the protection layer 24B and the control gate electrode 26B is formed in any of the cell region and the peripheral circuit region.

Therefore, since the height of the gate pattern is great, there may be generated an empty region, i.e., a void, that is not filled up in the process of filling a gap region between gate patterns with the first inter-layer insulation layer 31. For instance, a void may be generated in the gap region between the gate patterns when filling the gap region with the first inter-layer insulation layer 31, referring to a reference numeral ① in FIG. 2D, or a void may be generated in the process of filling the contact hole with the conducting layer 35 to form the contact plug, referring to a reference numeral ② in FIG. 2E.

The above phenomenon is usually caused in a gap region between gate patterns in a decoder region or a gap region between drain selection lines. This induces a defective like a short circuit between adjacent drain contacts in a subsequent process of forming the drain contacts.

FIG. 2F illustrates a plane view of a region where a drain contact is formed according to the prior art.

Referring to a process of forming the drain contact, after forming a contact hole exposing a portion of a substrate between drain selection lines by etching layers such as an inter-layer insulation layer, a drain contact plug is formed by filling the contact hole with a conducting layer.

At this point, referring to the reference numeral ② in FIG. 2E and a reference numeral ③ in FIG. 2F, adjacent drains may be connected to each other by a void generated in the process of filling the contact hole with the conducting layer and thus the defective like the short circuit may be caused.

SUMMARY OF THE INVENTION

An embodiment of the present invention is directed to providing a non-volatile memory device and a method for fabricating the same, capable of omitting a contact process of connecting a floating gate electrode and a control gate electrode.

Another embodiment of the present invention is directed to providing a non-volatile memory device and a method for fabricating the same, which are appropriate in preventing the generation of a void when filling a contact hole with an inter-layer insulation layer by lowering the height of a gate pattern.

In accordance with an aspect of the present invention, there is provided a method for fabricating a non-volatile memory device including a peripheral circuit region and a cell region, the method including: forming gate patterns over a substrate, the gate pattern including a tunnel insulation layer, a floating gate electrode, a charge blocking layer and a control gate electrode; and removing the control gate electrode and the charge blocking layer of the gate pattern formed in the peripheral circuit region.

In accordance with another aspect of the present invention, there is provided a method for fabricating a non-volatile memory device including a peripheral circuit region and a cell region, the method including: forming a tunnel insulation layer and a first conducting layer for a first floating gate electrode over a substrate; forming a trench by etching the first conducting layer, the tunnel insulation layer and the substrate to a given depth; forming an isolation layer by filling the trench with an insulation layer; forming a second conducting layer for a second floating gate electrode over a resultant structure where the isolation layer is formed in the peripheral circuit region; forming a charge blocking layer and a third conducting layer for a control gate electrode over a resultant structure where the second conducting layer is formed; forming gate patterns by etching the third conducting layer, the charge blocking layer, the second conducting layer and the first conducting layer; and removing a control gate electrode and the charge blocking layer formed in the peripheral circuit region.

In accordance with another aspect of the present invention, there is provided a non-volatile memory device including: a peripheral circuit region including a gate pattern that has a tunnel insulation layer and a floating gate electrode disposed over a substrate; and a cell region including a gate pattern that has the tunnel insulation layer, the floating gate electrode, a charge blocking layer and a control gate electrode disposed over the substrate.

In accordance with another aspect of the present invention, there is provided a non-volatile memory device including: a peripheral circuit region including a gate pattern that has a tunnel insulation layer, a first floating gate electrode and a second floating gate electrode disposed over a substrate; and a cell region including a gate pattern that has the tunnel insulation layer, the first floating gate electrode, a charge blocking layer and a control gate electrode disposed over the substrate.

DESCRIPTION OF SPECIFIC EMBODIMENTS

Figure 1:
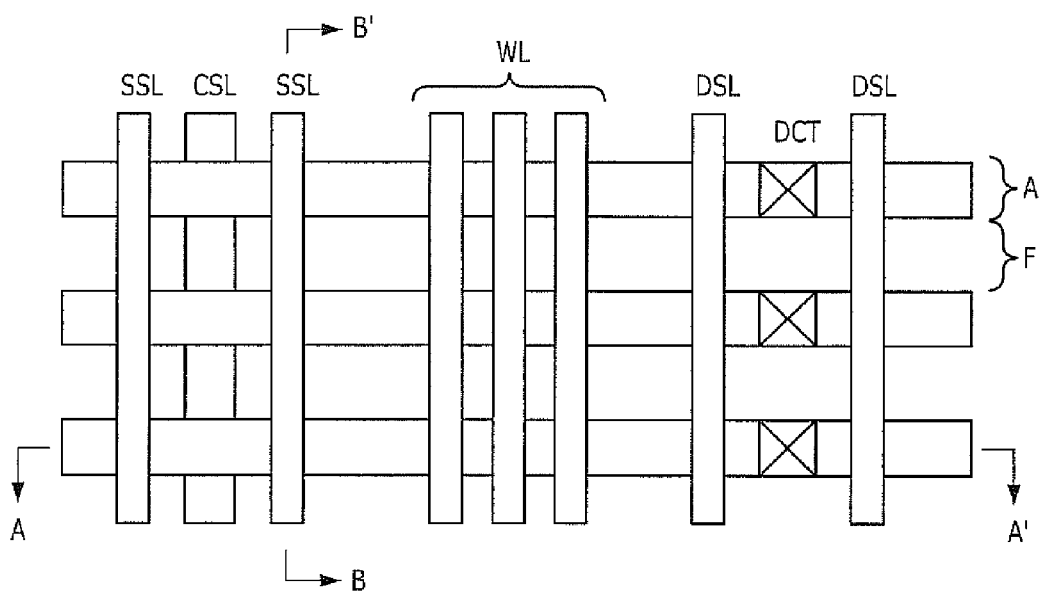
FIG. 1 illustrates a schematic diagram showing a layout of a non-volatile memory device according to the prior art.
Figure 2A:
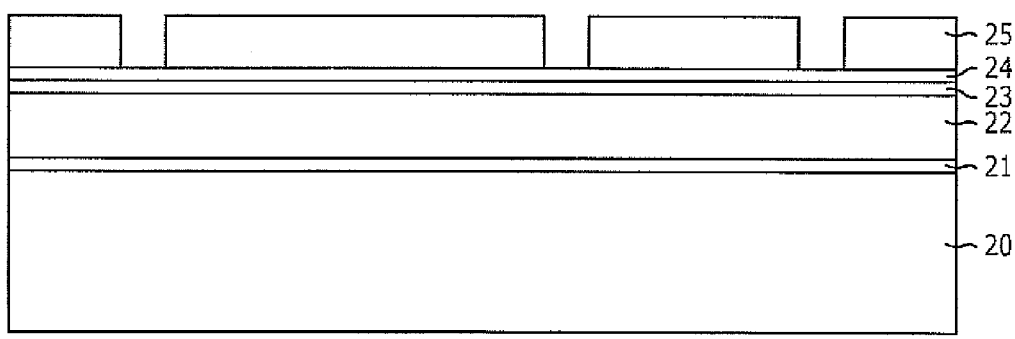
FIGS. 2A to 2E illustrate sectional views explaining a method for fabricating the non-volatile memory device according to the prior art.
Figure 2B:
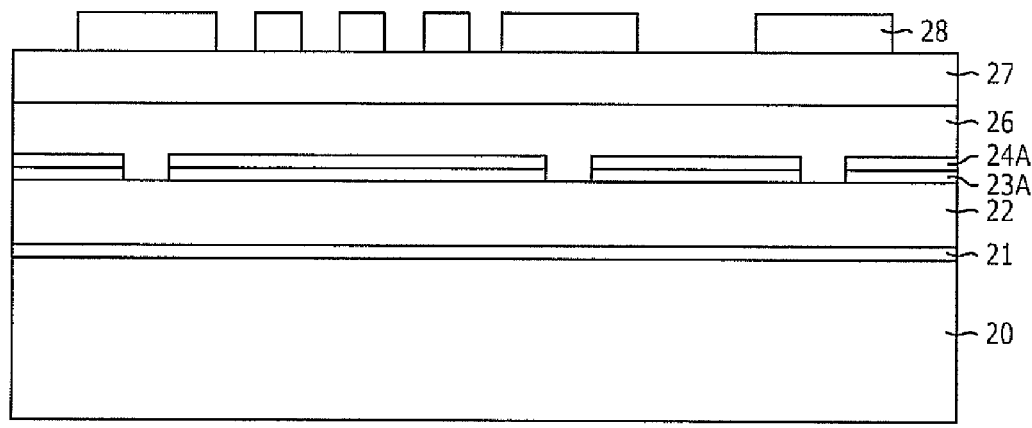
Figure 2C:
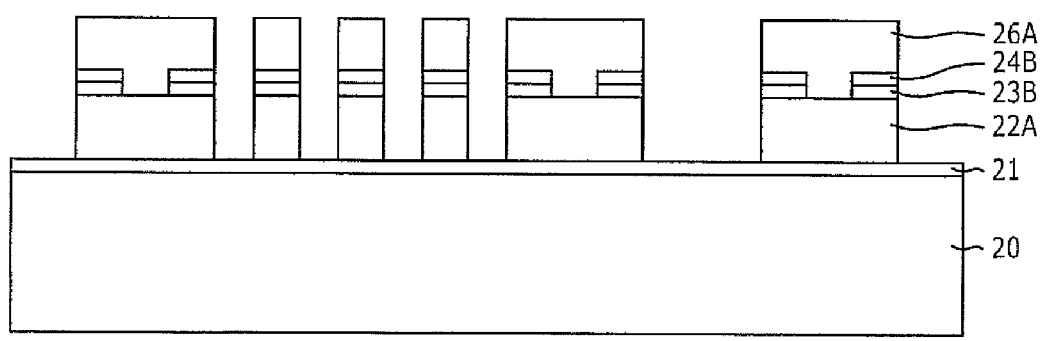
Figure 2D:
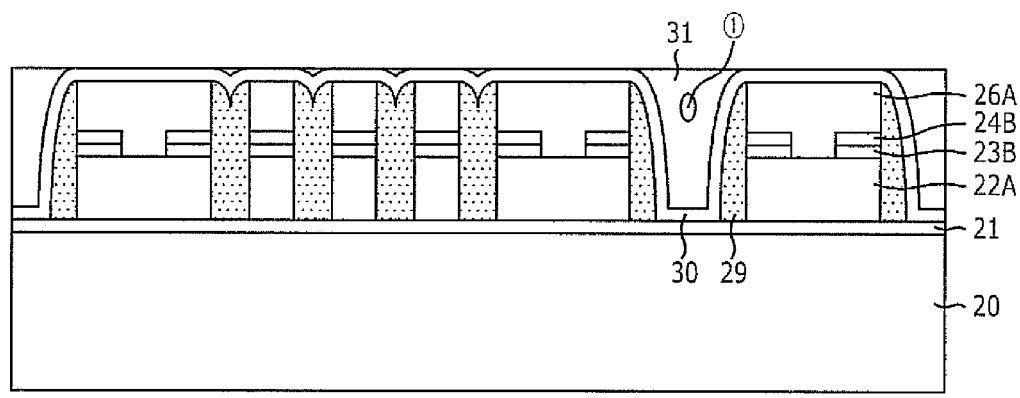
Figure 2E:
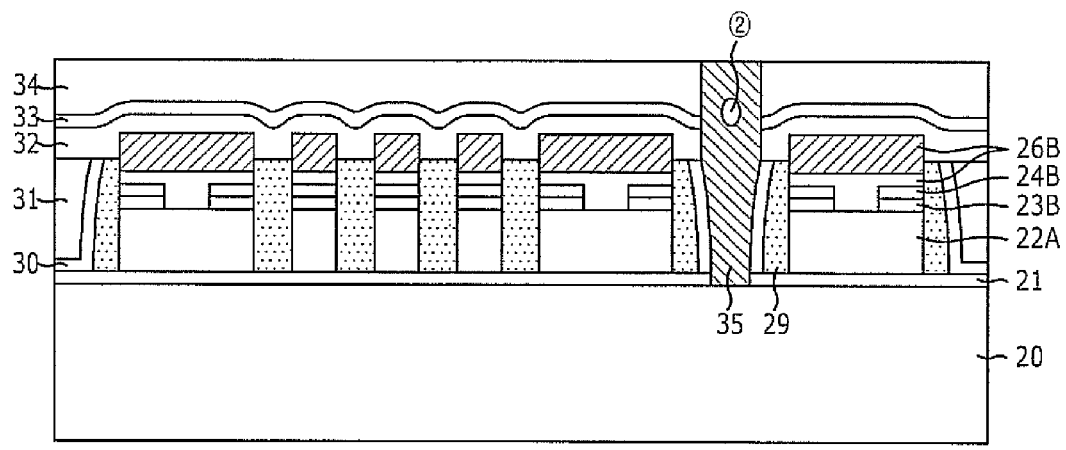
Figure 2F:
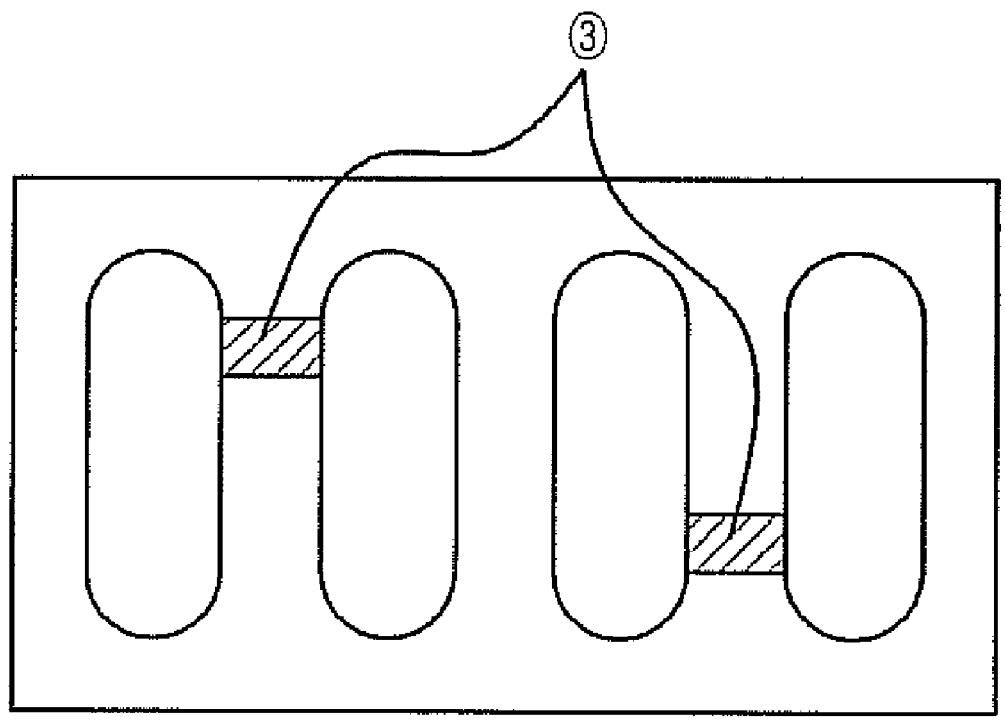
FIG. 2F illustrates a plane view of a region where a drain contact is formed according to the prior art.

Other objects and advantages of the present invention can be understood by the following description, and become apparent with reference to the embodiments of the present invention.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

Figure 3:
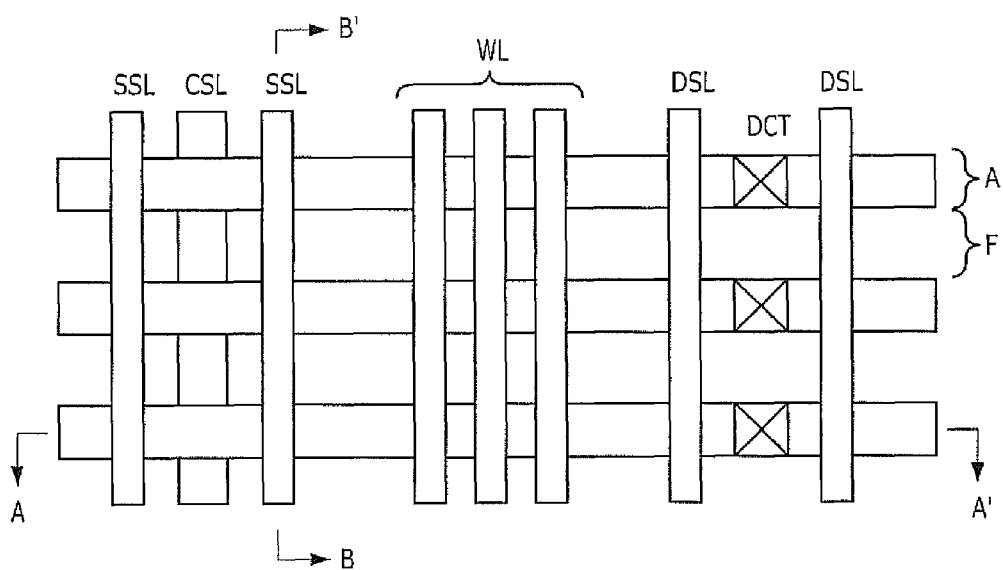
FIG. 3 illustrates a schematic diagram showing a layout of a non-volatile memory device in accordance with an embodiment of the present invention.

FIG. 3 illustrates a layout of a non-volatile memory device in accordance with an embodiment of the present invention.

Referring to FIG. 3, an active region A is defined by a device isolation layer formed in a line type that is disposed in a field region F. On a substrate, a bit line BL is disposed in a first direction A-A' and a plurality of source selection lines SSL and a plurality of drain selection lines DSL are disposed in a second direction B-B' intersecting with the first direction A-A'. Furthermore, a plurality of word lines WL is disposed between the source selection lines SSL and the drain selection lines DSL.

Herein, the source selection lines SSL connect gate electrodes of source selection transistors and a common source line CSL is disposed in a junction region between the source selection lines SSL. The drain selection lines DSL connect gate electrodes of the drain selection transistors and drain contact plugs DCT are disposed in a junction region between the drain selection lines DSL.

The source selection lines SSL or the drain selection lines DSL operate as typical transistors. A region where the source selection lines SSL and the drain selection lines DSL are disposed is referred to as a peripheral circuit region and a region where memory cells storing data are disposed is referred to as a cell region.

Figure 4A:
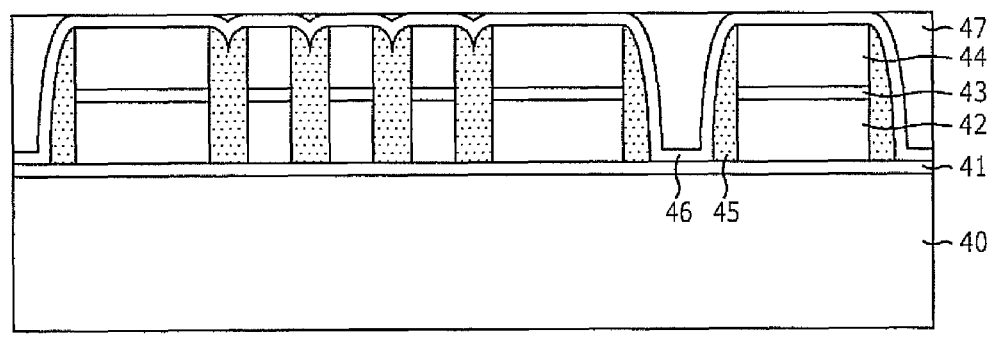
FIGS. 4A to 4C illustrate sectional views explaining a method for fabricating the non-volatile memory device in accordance with a first embodiment of the present invention.
Figure 4B:
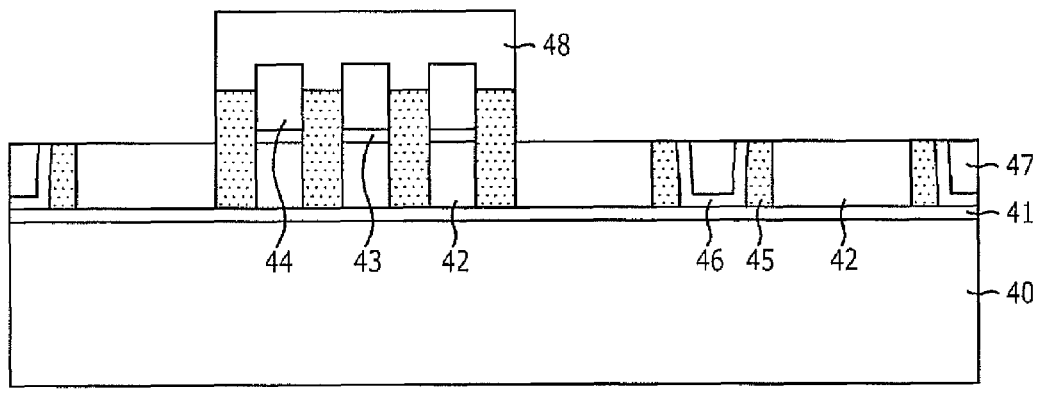
Figure 4C:
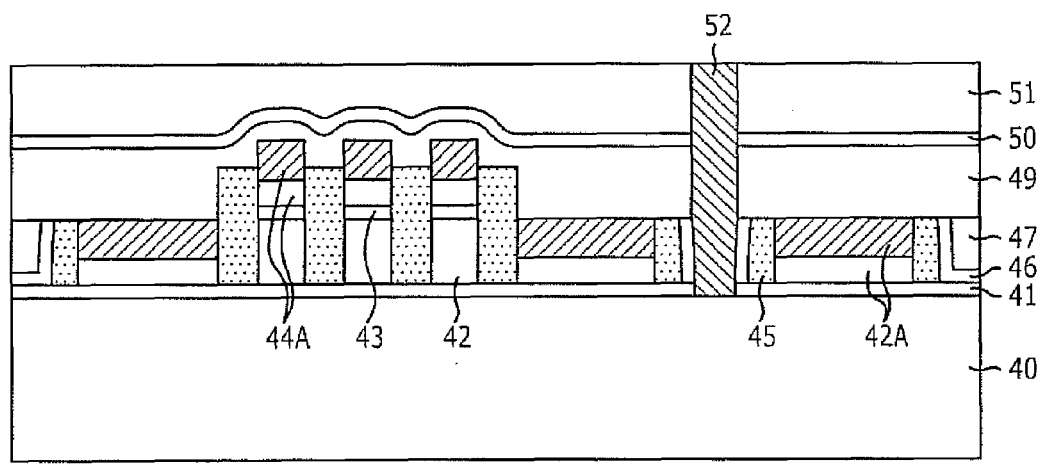

FIGS. 4A to 4C illustrate sectional views explaining a method for fabricating the non-volatile memory device in accordance with a first embodiment of the present invention and cross-sectional views taken along the first direction A-A' of FIG. 3.

Referring to FIG. 4A, a gate pattern including a tunnel insulation layer 41, a floating gate electrode 42, a charge blocking layer 43 and a control gate electrode 44 is formed on a substrate 40. Herein, a process of forming the gate pattern may be performed using various methods such as self-aligned shallow trench isolation (SA-STI), self-aligned floating gate (SA-FG) and advanced self-aligned STI (ASA-STI), and this embodiment of the present invention may be applied to various methods for forming the gate pattern. Since the methods for forming the gate pattern are apparent to those skilled in the art, the detailed processes of this embodiment are not described herein.

Then, a first spacer 45 is formed on a sidewall of the gate pattern. Herein, the first spacer 45 may be formed of oxide.

A second spacer 46 is formed on the whole surface of a resultant structure including the first spacer 45. The second spacer 46 is for a self align contact (SAC) etching and may include a material whose selectivity to the first spacer 45 is great. For instance, the second spacer 46 may be formed of nitride.

After forming a first inter-layer insulation layer 47 on the whole surface of a resultant structure including the second spacer 46, a planarization process is performed on the first inter-layer insulation layer 47 until a top surface of the second spacer 46 is exposed.

Referring to FIG. 4B, the first inter-layer insulation layer 47, the second spacer 46 and the first spacer 45 are etched back to a given depth from a top surface of the gate pattern to expose a portion of the control gate electrode 44.

Subsequently, after forming a mask pattern 48 exposing the peripheral circuit region while covering the cell region on a resultant structure obtained by performing the etch-back process, a process of exposing a top surface of the floating gate electrode 42 is performed by etching the first inter-layer insulation layer 47, the control gate electrode 44 and the charge blocking layer 43 using the mask pattern 48 as an etch barrier.

As a result, a gate pattern including the tunnel insulation layer 41 and the floating gate electrode 42 is formed in the peripheral circuit region and a gate pattern including the tunnel insulation layer 41, the floating gate electrode 42, the charge blocking layer 43 and the control gate electrode 44 is formed in the cell region. Therefore, a separate process of forming a charge blocking layer contact hole is not required.

Furthermore, in the process of removing the control gate electrode 44 and the charge blocking layer 43 in the peripheral circuit region, the first spacer 45, the second spacer 46 and the first inter-layer insulation layer 47 disposed in a gap region between gate patterns in the peripheral circuit region are also removed. Accordingly, although a void is generated in the process of filling the first inter-layer insulation layer 47, the void is removed in this removing process. As a result, it is possible to prevent a short type defective of a drain contact.

Then, although it is not shown, it is preferable to etch a part of thickness of the floating gate electrode 42 that is exposed by removing the control gate electrode 44 and the charge blocking layer 43. Through this, it is possible to further reduce the height of the gate pattern in the peripheral circuit region and thus the generation of a void in a subsequent process of forming a second inter-layer insulation layer may be prevented.

Referring to FIG. 4C, a metal silicidation process is performed on the floating gate electrode 42 of the gate pattern formed in the peripheral circuit region and the control gate electrode 44 of the gate pattern formed in the cell region.

Therefore, a gate pattern including a metal silicide floating gate electrode 42A is formed in the peripheral circuit region and a gate pattern including a metal silicide control gate electrode 44A is formed in the cell region. Like this, by directly siliciding the floating gate electrode 42 of the gate pattern formed in the peripheral circuit region, the performance of the memory device can be much improved.

Hereinafter, the metal silicidation process will be described in detail. First of all, a metal layer is formed on the whole surface of a resultant structure where the floating gate electrode 42 formed in the peripheral circuit region is exposed. The metal layer may be formed of cobalt (Co) or nickel (Ni). Then, a heat treatment process is employed to accomplish the metal silicidation on the floating gate electrode 42 formed in the peripheral circuit region and the control gate electrode 44 formed in the cell region. The metal silicidation process is terminated by removing the metal layer that is not reacted in the heat treatment process.

Subsequently, after forming a second inter-layer insulation layer 49 on the whole surface of a resultant structure obtained by performing the metal silicidation process, a third spacer 50 is formed on the whole surface of the second inter-layer insulation layer 49. The third spacer 50 is formed to protect the gate pattern and may be formed of nitride.

A third inter-layer insulation layer 51 is formed on the whole surface of a resultant structure including the third spacer 50.

A contact hole exposing a portion of the substrate 40 disposed between the gate patterns formed in the peripheral circuit region is formed by selectively etching the third inter-layer insulation layer 51, the third spacer 50, the second inter-layer insulation layer 49, the first inter-layer insulation layer 47, the second spacer 46 and the tunnel insulation layer 41. A contact plug is formed by filling the contact hole with a conducting layer 52.

As described above, it is possible to fabricate the non-volatile memory device including the peripheral circuit region that has the gate pattern including the tunnel insulation layer 41 and the metal silicide floating gate electrode 42A formed on the substrate 40 and the cell region that has the gate pattern including the tunnel insulation layer 41, the floating gate electrode 42, the charge blocking layer 43 and the metal silicide control gate electrode 44A.

By selectively removing the control gate electrode 44 and the charge blocking layer 43 of the gate pattern formed in the peripheral circuit region, the separate process of forming the charge blocking layer contact hole is not required. Therefore, it is possible to introduce a method for fabricating a non-volatile memory device that is more appropriate in improving a degree of integration of the memory device.

Moreover, by lowering the height of the gate pattern in the peripheral circuit region, it is possible to prevent a void from being generated in the process of forming the contact plug. Accordingly, it is also possible to avoid the short type defective that adjacent drains are connected to each other by the void.

FIGS. 5A to 5G illustrate sectional views explaining a method for fabricating the non-volatile memory device in accordance with a second embodiment of the present invention. FIGS. 5A to 5D illustrate cross-sectional views taken along the second direction B-B' of FIG. 3 and FIGS. 5E to 5G illustrate cross-sectional views taken along the first direction A-A' of FIG. 3.

In particular, the second embodiment of the present invention is to explain a method for fabricating a non-volatile memory device according to the ASA-STI process. Thus, there is described a method for additionally forming a second floating gate electrode formed as a line type on a first floating gate electrode to connect first floating gate electrodes formed as an island type. The explanation for other processes already explained in the first embodiment is omitted herein.

Figure 5A:
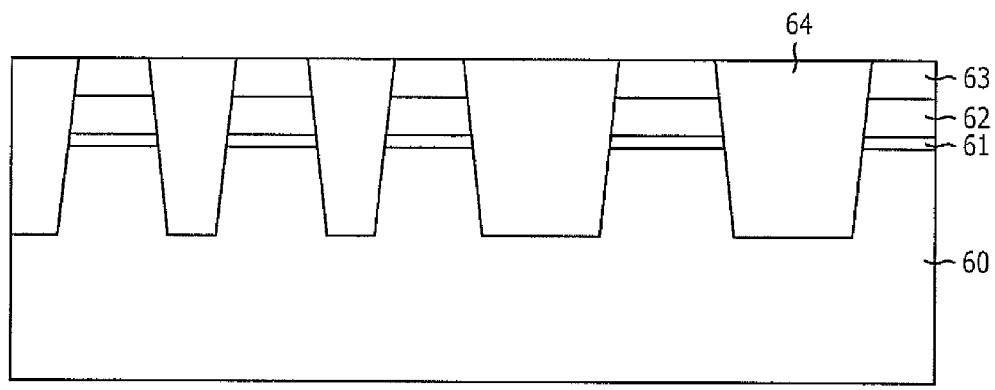
FIGS. 5A to 5G illustrate sectional views explaining a method for fabricating the non-volatile memory device in accordance with a second embodiment of the present invention.

Referring to FIG. 5A, a tunnel insulation layer 61, a first floating gate electrode conducting layer 62 and a hard mask layer 63 are formed on a substrate 60. Herein, the tunnel insulation layer 61 may be formed of oxide; the first floating gate electrode conducting layer 62 may be formed of polysilicon; and the hard mask layer 63 may be formed of nitride.

Then, after etching the hard mask layer 63 using an isolation (ISO) mask, the first floating gate electrode conducting layer 62 and the tunnel insulation layer 61 are sequentially etched using the etched hard mask layer as an etch barrier, and the substrate 60 is etched to a given depth to form a device isolation trench. In this process of forming the device isolation trench, the first floating gate electrode conducting layer 62 is patterned as a line type extending along the first direction A-A'.

A device isolation layer 64 is formed by filling the device isolation trench with an insulation layer.

Figure 5B:
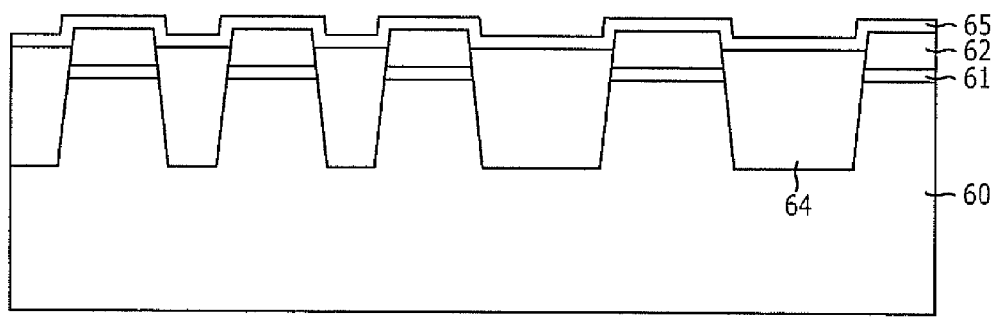

Referring to FIG. 5B, after adjusting an effective field oxide height (EFH) by etching a part of thickness of the device isolation layer 64, a top surface of the first floating gate electrode conducting layer 62 is exposed by removing the hard mask layer 63.

Subsequently, a second floating gate electrode conducting layer 65 is formed on a resultant structure where the top surface of the first floating gate electrode conducting layer 62 is exposed. Herein, the second floating gate electrode conducting layer 65 is employed to connect first floating gate electrodes formed as the island type that are to be formed by a subsequent gate patterning process. The second floating gate electrode conducting layer 65 may be formed of a polysilicon layer. Furthermore, the second floating gate electrode conducting layer 65 may have a thickness of approximately 250 Å to approximately 350 Å.

Figure 5C:
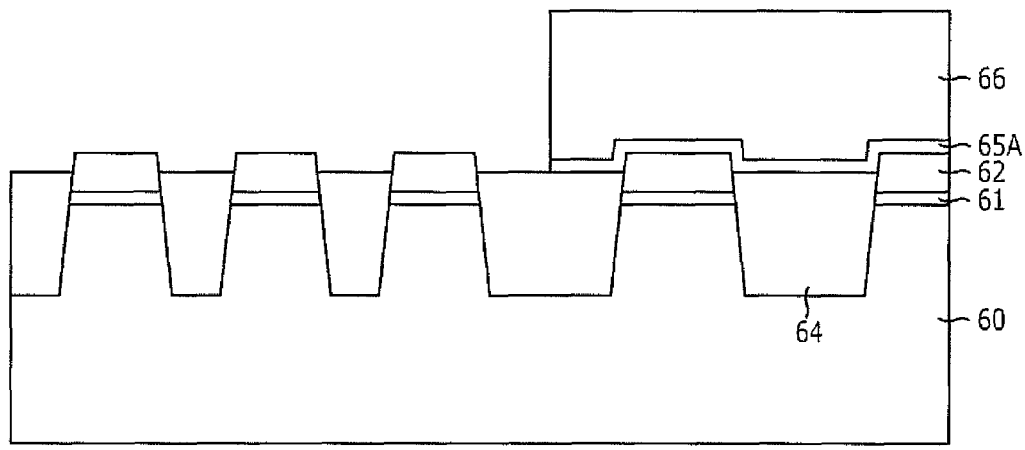

Referring to FIG. 5C, a mask pattern 66 is formed on a resultant structure where the second floating gate electrode conducting layer 65 is formed, wherein the mask pattern 66 exposes the cell region while covering the peripheral circuit region. Then, the floating gate electrode conducting layer 65 formed in the cell region is removed using the mask pattern 66 as an etch barrier.

As a result, the second floating gate electrode conducting layer 65 remains only in the peripheral circuit region and it is indicated by a reference numeral 65A.

Figure 5D:
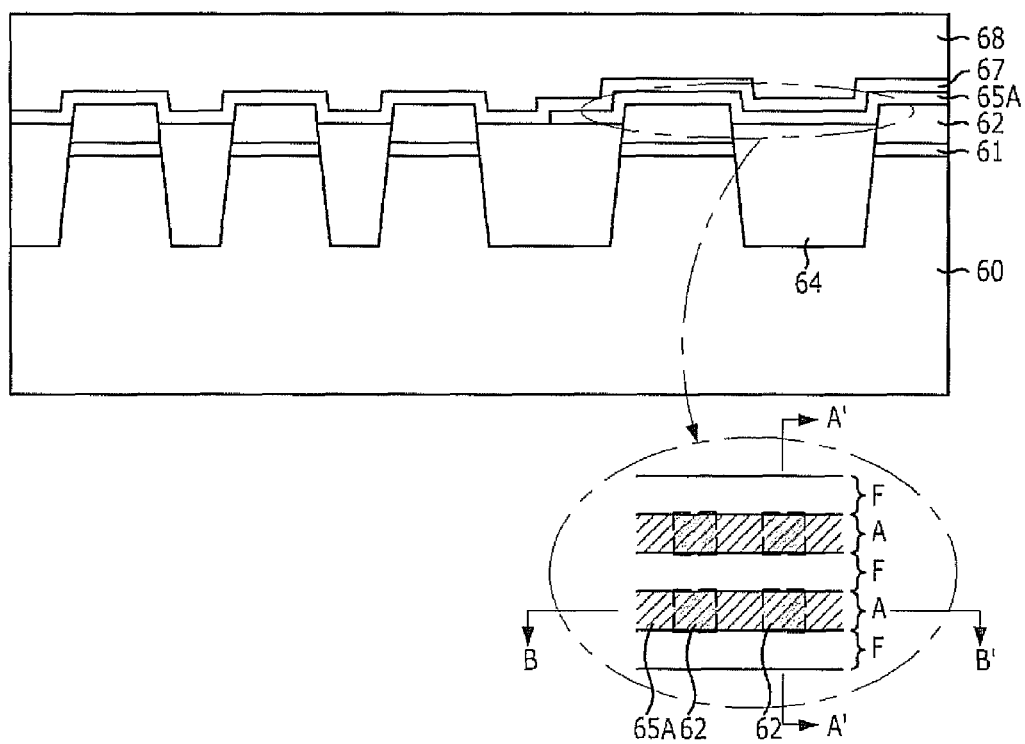

Referring to FIG. 5D, after forming a charge blocking layer 67 and a control gate electrode conducting layer 68 on a resultant structure where the second floating gate electrode conducting layer 65A is formed, a gate patterning process is performed thereon.

At this time, in the cell region, a gate pattern including the tunnel insulation layer 61, a first floating gate, i.e., the first floating gate electrode conducting layer 62, the charge blocking layer 67 and a control gate electrode, i.e., the control gate electrode conducting layer 68, is formed by etching the control gate electrode conducting layer 68, the charge blocking layer 67 and the first floating gate electrode conducting layer 62.

Furthermore, in the peripheral circuit region, a gate pattern including the tunnel insulation layer 61, the first floating gate 62, the second floating gate electrode 65A, the charge blocking layer 67 and the control gate electrode 68 is formed by etching the control gate electrode conducting layer 68, the charge blocking layer 67, the second floating gate electrode conducting layer 65A and the first floating gate electrode conducting layer 62.

Herein, in the etching process of forming the gate pattern, the first floating gate electrode conducting layer 62 formed as the line type is patterned to the island type. Namely, first floating gate electrodes 62 of a plurality of transistors formed in the peripheral circuit region are formed as the island type so that they are separated from each other, and they are arranged in the first and second directions to have a certain distance there between.

Moreover, in the etching process of forming the gate pattern, the second floating gate electrode conducting layer 65A covering the peripheral circuit region is patterned to be formed as the line type. That is, the second floating gate electrode conducting layer 65A is patterned to a plurality of lines extending parallel to the second direction B-B'.

Therefore, the second floating gate 65A connects the first floating gate electrodes 62 formed as the island type which is formed under the second floating gate 65A. That is, a plurality of first floating gate electrodes 62 arranged in the second direction B-B' is connected to each other by the second floating gate electrode 65A formed as the line type and extending along the second direction B-B'.

Figure 5E:
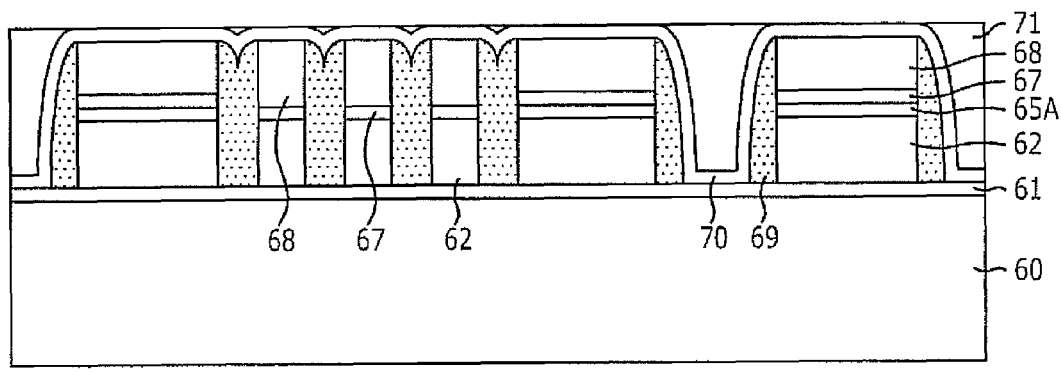

Referring to FIG. 5E, after forming a first spacer 69 on a sidewall of the gate pattern, a second spacer 70 is formed on the whole surface of a resultant structure including the first spacer 69.

Then, after forming a first inter-layer insulation layer 71 on the whole surface of a resultant structure including the second spacer 70, a planarization process is performed until a top surface of the second spacer 70 is exposed.

Figure 5F:
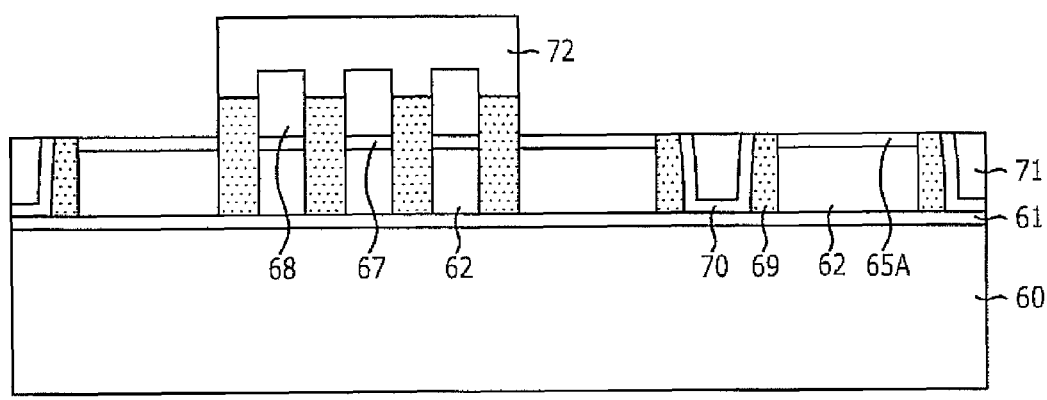

Referring to FIG. 5F, the first inter-layer insulation layer 71, the second spacer 70 and the first spacer 69 are etched back to a given depth from a top surface of the gate pattern to expose a portion of the control gate electrode 68.

Subsequently, after forming a mask pattern 72 exposing the peripheral circuit region while covering the cell region on a resultant structure obtained by performing the etch-back process, the first inter-layer insulation layer 71, the control gate electrode 68 and the charge blocking layer 67 are etched using the mask pattern 72 as an etch barrier to thereby expose a top surface of the second floating gate electrode 65A.

Accordingly, the gate pattern including the tunnel insulation layer 61, the first floating gate electrode 62 and the second floating gate electrode 65A is formed in the peripheral circuit region, and the gate pattern including the tunnel insulation layer 61, the first floating gate electrode 62, the charge blocking layer 67 and the control gate electrode 68 is formed in the cell region.

Figure 5G:
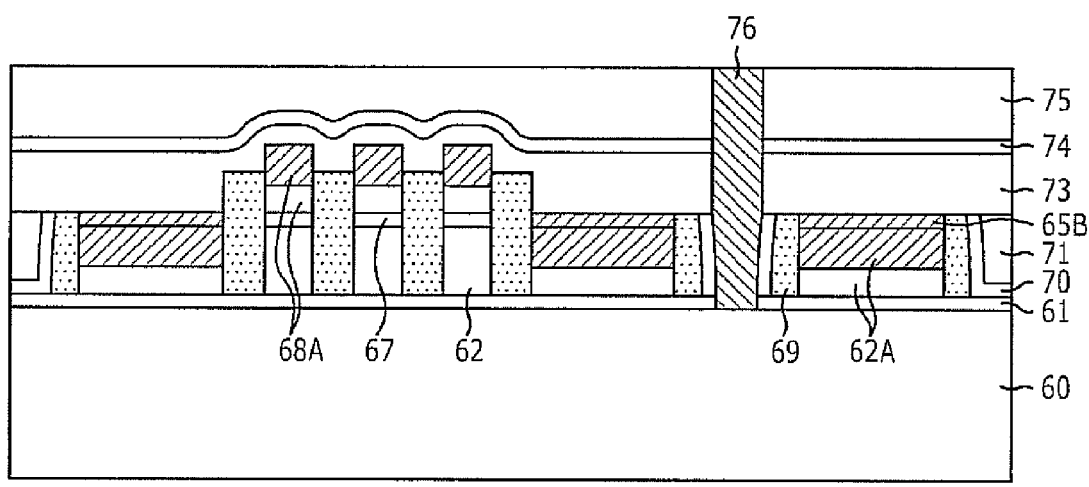

Referring to FIG. 5G, the metal silicidation process is performed on the floating gate electrodes 65A and 62 of the gate pattern formed in the peripheral circuit region and the control gate electrode 68 of the gate pattern formed in the cell region. In accordance with another embodiment, in the peripheral circuit region, the silicidation process may be performed on only the second floating gate electrode 65A. A degree of the metal silicidation may be determined by considering the performance of the memory device.

As a result, a gate pattern including metal silicide floating gate electrodes 65B and 62A is formed in the peripheral circuit region and a gate pattern including a metal silicide control gate electrode 68A is formed in the cell region.

After that, a second inter-layer insulation layer 73 is formed on the whole surface of a resultant structure, where the metal silicidation process is performed, and a third spacer 74 is then formed on the whole surface of the second inter-layer insulation layer 73. Herein, the second spacer 74 may be formed of nitride.

Subsequently, a third inter-layer insulation layer 75 is formed on the whole surface of a resultant structure including the third spacer 74.

Then, a contact hole is formed by selectively etching the third inter-layer insulation layer 75, the third spacer 74, the second inter-layer insulation layer 73, the first inter-layer insulation layer 71, the second spacer 70 and the tunnel insulation layer 61, wherein the contact hole is formed to expose a portion of the substrate 60 disposed between gate patterns formed in the peripheral circuit region. Subsequently, a contact plug is formed by filling the contact hole with a conducting layer 76.

As described above, in accordance with the present invention, it is possible to fabricate the non-volatile memory device including the peripheral circuit region that has the gate pattern including the tunnel insulation layer 61, the first floating gate electrode 62 and the second floating gate electrode 65 formed on the substrate 60, and the cell region that has the gate pattern including the tunnel insulation layer 61, the first floating gate electrode 62, the charge blocking layer 67 and the control gate electrode 68 formed on the substrate 60.

Like this, by additionally forming the second floating gate electrode 65A on the first floating gate electrode 62, although the first floating gate electrode 62 is formed as the island type through the ASA-STI process, the first floating gate electrodes 62 formed as the island type may be connected to each other by the second floating gate electrode 65A.

In accordance with the embodiments of the present invention, since the control gate electrode and the charge blocking layer of the gate pattern formed in the peripheral circuit region are removed, it is not required to perform the separate process of forming the charge blocking layer contact hole.

Therefore, it is possible to simplify the process of fabricating the memory device and introduce the process that is more appropriate in improving the degree of integration of the memory device. In particular, it is possible to improve the performance of the memory device by directly metal-siliciding the floating gate electrode that is exposed by removing the control gate electrode and the charge blocking layer, and the signal delay due to the distance from the contact is not caused since the gate pattern including the tunnel insulation layer and the floating gate electrode is formed in the peripheral circuit region. Furthermore, since it is not required to form a protection layer for preventing the charge blocking layer from being damaged when forming the charge blocking layer contact hole, it is possible to prevent the performance deterioration of the memory device due to the unstable interface between the protection layer and the control gate electrode.

In accordance with the embodiments of the present invention, although a void is generated in the process of filling a gap region between gate patterns with the inter-layer insulation layer, the void is also removed when the control gate electrode and the charge blocking layer are removed. Moreover, since the height of the gate pattern can be lowered when removing the control gate electrode and the charge blocking layer, the generation of a void when forming a subsequent inter-layer insulation layer can be prevented. Therefore, when forming a subsequent drain contact, it is possible to prevent the occurrence of a contact failure due to the connection between adjacent drain contacts that is caused by the void.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
    a peripheral circuit region including a gate pattern that has a tunnel insulation layer and a floating gate electrode disposed over a substrate; and
    a cell region including a gate pattern that has the tunnel insulation layer, the floating gate electrode, a charge blocking layer and a control gate electrode disposed over the substrate, wherein the gate pattern disposed in the peripheral circuit region is made by selectively removing the control gate electrode and the charge blocking layer of the gate pattern disposed in the peripheral circuit region after forming gate patterns including the tunnel insulation layer, the floating gate electrode, the charge blocking layer and the control gate electrode disposed over the substrate to expose an entire upper surface of the floating gate electrode of the gate pattern formed in the peripheral circuit region.

2. The non-volatile memory device of claim 1, wherein the floating gate electrode of the gate pattern disposed in the peripheral circuit region and the control gate electrode of the gate pattern disposed in the cell region are metal-silicided.

3. A non-volatile memory device, comprising:
    a peripheral circuit region including a gate pattern that has a tunnel insulation layer, a first floating gate electrode and a second floating gate electrode disposed over a substrate; and
    a cell region including a gate pattern that has the tunnel insulation layer, the first floating gate electrode, a charge blocking layer and a control gate electrode disposed over the substrate, wherein the gate pattern disposed in the peripheral circuit region is made by selectively removing the control gate electrode and the charge blocking layer of the gate pattern disposed in the peripheral circuit region after forming gate patterns including the tunnel insulation layer, the first floating gate electrode, the second floating gate electrode, the charge blocking layer and the control gate electrode disposed over the substrate to expose an entire upper surface of the second floating gate electrode of the gate pattern formed in the peripheral circuit region.

4. The non-volatile memory device of claim 3, wherein the gate pattern disposed in the peripheral circuit region includes first floating gate electrodes formed as an island type that are connected to each other by the second floating gate electrode formed as a line type.

5. The non-volatile memory device of claim 3, wherein the floating gate electrodes of the gate pattern disposed in the peripheral circuit region and the control gate electrode of the gate pattern disposed in the cell region are metal-silicided.

* * * * *